United States Patent
Kuo et al.

(10) Patent No.: US 9,343,555 B2
(45) Date of Patent: May 17, 2016

(54) METHODS AND APPARATUS FOR ESD STRUCTURES

(71) Applicant: Taiwan Semiconductor Manufacturing Company, Ltd., Hsin-Chu (TW)

(72) Inventors: Hsi-Yu Kuo, Hsin-Chu (TW); Chi-Kuang Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/763,337

(22) Filed: Feb. 8, 2013

(65) Prior Publication Data

US 2014/0225157 A1    Aug. 14, 2014

(51) Int. Cl.
*H01L 29/74*    (2006.01)
*H01L 29/66*    (2006.01)
*H01L 27/02*    (2006.01)

(52) U.S. Cl.
CPC ............ *H01L 29/74* (2013.01); *H01L 27/0259* (2013.01); *H01L 29/66363* (2013.01)

(58) Field of Classification Search
CPC ............ H01L 27/0255; H01L 27/0259; H01L 27/0262; H01L 29/735
USPC .................................. 257/173, 355
See application file for complete search history.

(56) References Cited

U.S. PATENT DOCUMENTS

| | | | | |
|---|---|---|---|---|
| 4,652,895 | A | * | 3/1987 | Roskos ......................... 257/551 |
| 5,212,398 | A | * | 5/1993 | Matsunaga et al. ........... 257/356 |
| 5,557,139 | A | * | 9/1996 | Palara ........................... 257/592 |
| 5,747,837 | A | * | 5/1998 | Iwase .................. H01L 27/0259 257/173 |
| 7,525,779 | B2 | | 4/2009 | Chen et al. |
| 2002/0109190 | A1 | | 8/2002 | Ker et al. |
| 2006/0043489 | A1 | * | 3/2006 | Chen et al. .................... 257/355 |
| 2011/0248383 | A1 | * | 10/2011 | Ren et al. ...................... 257/577 |
| 2013/0082353 | A1 | * | 4/2013 | Kuo ...................... H01L 29/735 257/591 |

* cited by examiner

*Primary Examiner* — Jerome Jackson, Jr.
*Assistant Examiner* — Fang-Xing Jiang
(74) *Attorney, Agent, or Firm* — Slater Matsil, LLP

(57) ABSTRACT

Methods and apparatus are disclosed for ESD protection circuits. An ESD protection circuit may comprise a first region of an n type material, a second region of a p type material adjacent to the first region, a third region of an n type material within the second region and separated from the first region, and a fourth region of a p type material within the third region. There may be multiple parts within the first region and the second region, made of different n type or p type materials. An ESD protection circuit may further comprise a fifth region of a p type material, contained within the first region.

20 Claims, 6 Drawing Sheets

METHODS AND APPARATUS FOR ESD STRUCTURES

BACKGROUND

Electrostatic discharge (ESD) is the sudden flow of electricity between two objects caused by a contact, an electrical short, or a dielectric breakdown. ESD can be caused by a buildup of static electricity by tribocharging, or by electrostatic induction. ESD includes spectacular electric sparks, but also less dramatic forms which may be neither seen nor heard, yet still be large enough to cause damage to sensitive electronic devices. ESD can cause a range of harmful effects, as well as failure of integrated circuits (ICs).

Electrostatic discharge ("ESD") protection circuits are needed for ICs. The ESD protection circuits provide a path to bypass current from the terminal to a ground or from the terminal to a power supply rail, so that the current due to an ESD event bypasses the internal circuitry. Voltages far in excess of the normal operating voltages, in both positive and negative magnitudes, are observed during short duration electrostatic discharge events. The ESD protection circuits prevent the corresponding ESD current from destroying sensitive components in the protected IC.

An ESD protection circuit can be triggered in response to a trigger voltage over a threshold, and then safely conduct ESD stress current through an alternative path and thus protect the internal circuitry. After the ESD protection circuit is triggered, it will remain active as long as a voltage over a "holding voltage" is present. If the "holding voltage" for an ESD protection circuit is too low, the ESD protection circuit will likely stay active when the IC is no longer under ESD stress. Accordingly high holding voltages for ESD protection circuits are desirable.

Dynamically triggered MOS transistors are extensively used as ESD protection circuits in low voltage applications for many general purpose IO libraries. However, in high voltage applications, dynamically triggered MOS transistors typically occupy large areas. Furthermore, dynamically triggered MOS transistors are not suitable for applications that have a noisy power. Other alternatives for ESD protection circuits are snapback devices such as silicon controlled rectifier (SCR) circuits and bipolar junction transistors (BJTs), which have smaller silicon areas and reduced leakages. However, the holding voltage of these snapback devices is low in most cases, leading to a large gap between the trigger voltage and the holding voltage. Improved ESD protection circuits are needed with high holding voltages, and reduced gap between the trigger voltage and the holding voltage, which is more suitable for high voltage applications.

BRIEF DESCRIPTION OF THE DRAWINGS

For a more complete understanding of the illustrative embodiments, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example embodiments and are not necessarily drawn to scale.

DETAILED DESCRIPTION

Figure 1A:
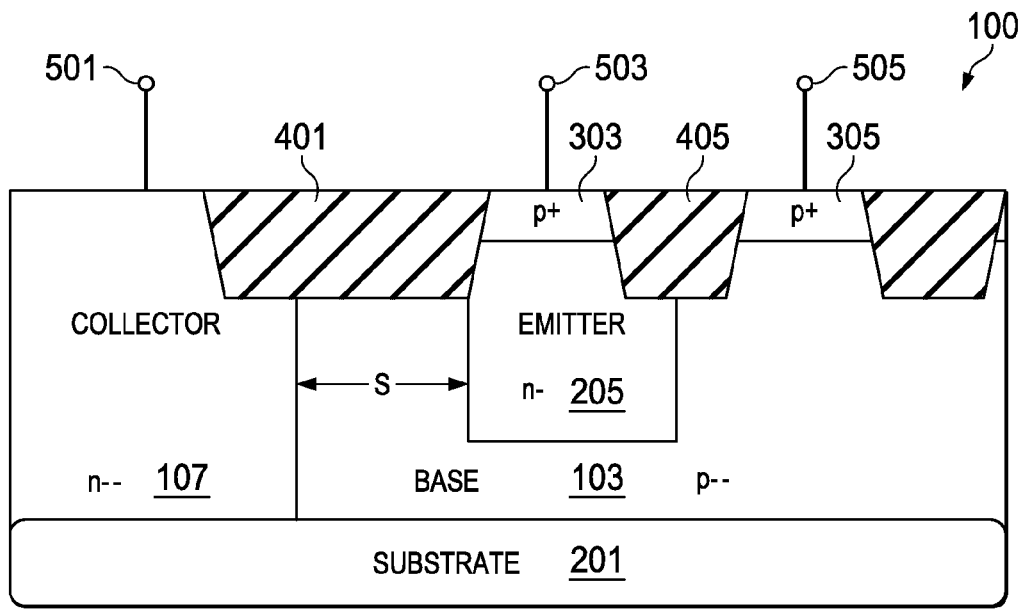
FIGS. 1(a)-1(d) illustrate in cross sectional views and a circuit diagram of embodiments of ESD protection circuits.

The making and using of illustrative example embodiments are discussed in detail below. It should be appreciated, however, that an illustrative embodiment provides many applicable inventive concepts that can be embodied in a wide variety of specific contexts. The embodiments herein are illustrative examples used for explanation but do not limit the scope of the disclosure, and do not limit the scope of the appended claims.

Methods and apparatus are disclosed for ESD protection circuits. An ESD protection circuit may comprise a first region of a first n type material, a second region of a first p type material adjacent to the first region, a third region of a second n type material within the second region and separated from the first region, and a fourth region of a second p type material within the third region. The first region, second region, and the third region may function as a lateral NPN bipolar junction transistor (BJT), while the third region and the fourth region may function as an embedded PN diode, which increases the ESD protection circuit holding voltage compared to the holding voltage of a NPN BJP only. There may be multiple parts within the first region and the second region, made of different n type or p type materials. An ESD protection circuit may further comprise a fifth region of a p type material, and contained within the first region. The fifth region, the first region, the second region, and the third region form a silicon controlled rectifier (SCR) circuit with a PNPN structure while the third region and the fourth region may function as an embedded PN diode, which increases the ESD protection circuit holding voltage compared to the holding voltage of a SCR only circuit.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1(a)-1(d) illustrate in cross sectional views and a circuit diagram of embodiments of an ESD protection circuit 100. Semiconductor manufacturing processes that may be used to form the ESD protection circuit 100 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, tetraethoxysilane (TEOS), spun on glass and other oxide and nitride depositions, planarization processes such as chemical mechanical planarization (CMP), forming isolation regions using trenches or local oxidation of silicon (LOCOS) and the like.

In FIG. 1(a), a portion of a semiconductor substrate 201 is shown. The semiconductor substrate 201 may be a p type doped substrate, or an n type doped substrate, which means that the semiconductor substrate 201 may be doped with either n type or p type impurities. The semiconductor substrate 201 may be formed from silicon, gallium arsenide, silicon germanium or other known semiconductor materials used in semiconductor device processing. Although in the illustrated examples presented herein for explanation a semiconductor substrate is used, in other alternative embodiments epitaxially grown semiconductor materials may be used, or, silicon on insulator (SOI) layer may be used, as the substrate 201.

As it is known, dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers, as is known.

The doping concentration amounts for the well region and the diffusions described may vary with the process used and the particular design. Doping concentrations at a p type material or an n type material may range from 1E14 atoms/cm$^3$ to 1E22 atoms/cm$^3$, with a p+/n+ material with concentrations being greater than about 1E18/cm$^3$, for example. Some other ranges of concentrations may be used, such as a n−−/p−− material with a doping concentration less than 1E14 atoms/cm$^3$, a n−/p− material with a doping concentration ranging from 1E14 atoms/cm$^3$ to 1E16 atoms/cm$^3$, a n/p material with a doping concentration ranging from 1E16 atoms/cm$^3$ to 1E18 atoms/cm$^3$, a n+/p+ material with a doping concentration ranging from 1E18 atoms/cm$^3$ to 1E20 atoms/cm$^3$, and a n++/p++ material with a doping concentration ranging larger than 1E20 atoms/cm$^3$. Further alternative ranges of concentrations may be used, such as a n−−/p−− material with a doping concentration range around $10^{15}$~$10^{18}$/cm$^3$, and a n−/p− material with a doping concentration 5~100 times heavier than the concentration of a n−−/p−− material.

Figure 1B:
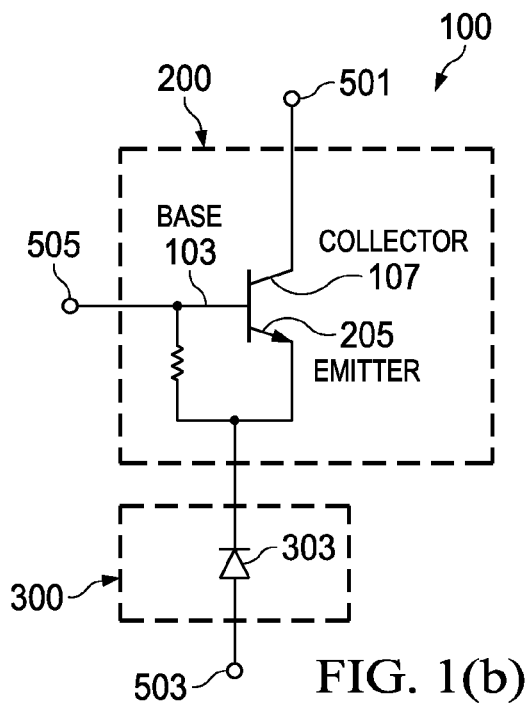
Figure 1C:
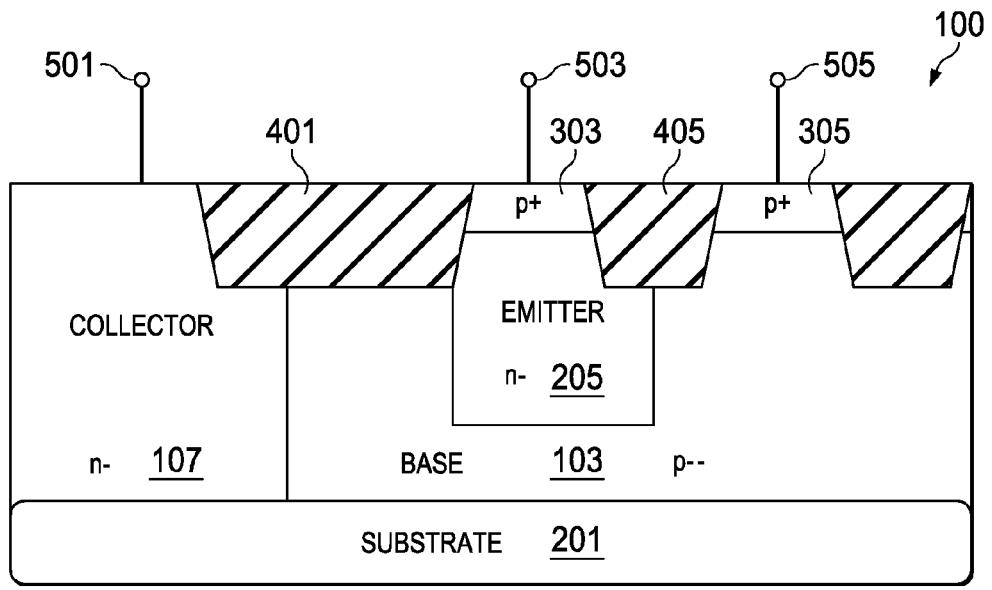

In FIG. 1(a), the ESD protection circuit 100 comprises a first region 107, a second region 103, a third region 205, and a fourth region 303. The first region 107 comprises a first n type material. The material for the first region 107 in FIG. 1(a) is shown as an n−− type material. It is understood that any other n type material may be used. For example, as shown in FIG. 1(c), the first region 107 comprises an n− type material. The second region 103 comprises a first p type material. The material for the second region 103 in FIG. 1(a) is shown as a p−− type material. It is understood that any other p type material may be used, which are not shown. The third region 205 comprises a second n type material, formed within the second region 103. The material for the third region 205 in FIG. 1(a) is shown as an n− type material. It is understood that any other n type material may be used, which are not shown. Furthermore, the fourth region 303 comprises a second p type material, formed within the third region 205. The material for the fourth region 303 in FIG. 1(a) is shown as a p+ type material. It is understood that any other p type material may be used, which are not shown. An isolation area 401 is formed to separate the first region 107 from the third region 205 and the fourth region 303.

A contact 501 is formed in connection with the first region 107 and another contact 503 is formed in connection with the fourth region 303. An additional isolation area 405 may be formed within the second region 103 and the third region 205 to separate the fourth region 303 from other area of the two regions. An additional diffusion area 305 may be formed next to the isolation area 405, and connected to a contact 505. The additional diffusion area 305 comprises another p type material shown as a p+ material in FIG. 1(a). There may be no additional diffusion area 305, and the contact 505 may be connected directly to the second region 103.

The isolation area 401 and 405 may be formed, for example, using shallow trench isolation (STI), where an oxide, nitride or similar dielectric is formed in a trench region. Alternative embodiments include local oxidation of silicon (LOCOS) isolation, or any other form of isolation.

The second region 103 is formed proximate to and adjacent to the first region 107 and the common boundary of the regions 107 and 103 in FIG. 1(a) thus forms an n-p junction. The third region 205 is formed within the second region 103 and the common boundary of the regions 205 and 103 thus forms another p-n junction. These three regions 103, 107, and 205 may function as a lateral NPN bipolar junction transistor (BJT) 200, as shown in FIG. 1(b) in a circuit schematic diagram. The lateral NPN BJT 200 comprises a collector formed by the first region 107, a base formed by the second region 103, and an emitter formed by the third region 205. The contact 501 is the contact for the collector. The contact 505 is the contact for the base 103.

In addition, the fourth region 303 is formed within the third region 205, and the common boundary of the regions 205 and 303 thus forms another p-n junction, which is an embedded PN diode 300 as shown in FIG. 1(b). The contact 503 is the contact for the fourth region 303. The p type material at the fourth region 303 above the n type material at the second region 205, creates a barrier potential of the embedded PN diode 300, which shifts the holding voltage for the ESD protection circuit 100 upwards from the holding voltage of the NPN BJT 200 alone. As a result, the holding voltage of the ESD protection circuit 100 is equal to a sum of the holding voltage of the NPN BJT 200 and the block voltage of the PN diode 300. The higher holding voltage of the ESD protection circuit 100 reduces the gap between the trigger voltage and the holding voltage for the ESD protection circuit 100.

The ESD protection circuit 100 shown in FIG. 1(a) comprises a lateral NPNP (NPN BJT+PN diode) structure, which can be manufactured in a process compatible with the standard CMOS process. Furthermore, the trigger voltage of the ESD protection circuit 100 may be determined by the layout parameter S, which is the distance between the boundary of the third region 205 to the boundary of the first region 107. When S is changed, the ESD protection circuit 100 will have a different trigger voltage.

Different n type material may be used for the first region 107 comprising a first n type material, and the third region 205 comprising a second n type material, formed within the second region 103. For example, as shown in FIG. 1(c), an n− type material may be used for the first region 107, which acts as the collector for the NPN BJT, while the second n type material used for the third region 205 is still an n− type material. The embodiment in FIG. 1(c) further comprises a second region 103 comprising a first p type material, and a fourth region 303 comprising a second p type material, formed within the third region 205. An isolation area 401 is formed to separate the first region 107 and the third region 205. A contact 501 may be formed in connection with the first region 107 and another contact 503 may be formed in connection with the fourth region 303. An additional isolation area 405 may be formed within the second region 103 and the third region 205 to separate the fourth region 303 from other area of the two regions. An additional diffusion area 305 may be formed next to the isolation area 405, and connected to a contact 505.

Figure 1D:
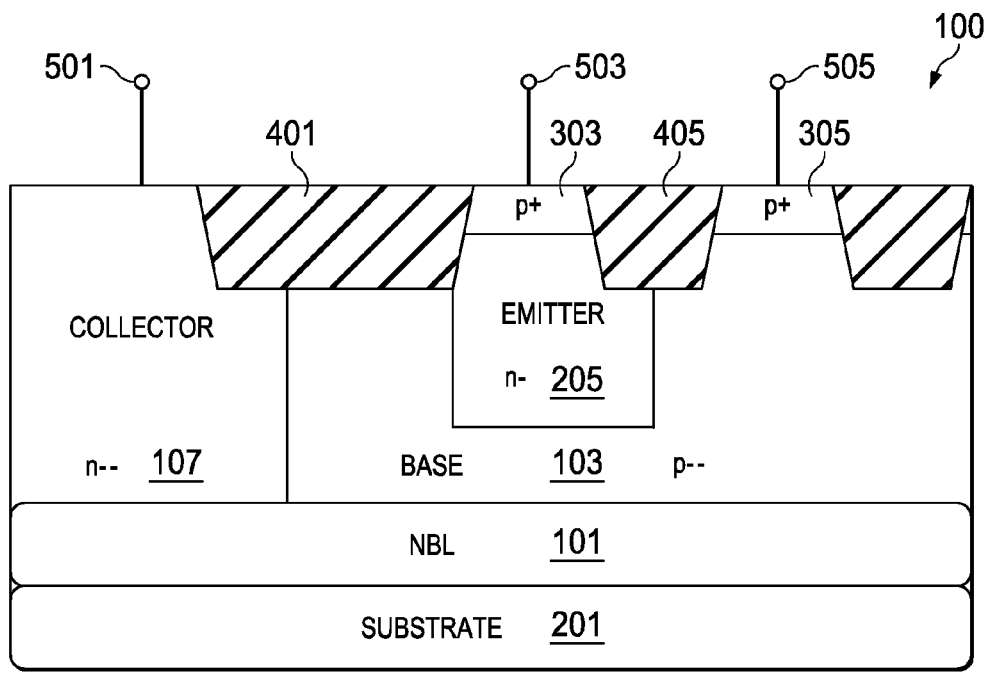

As illustrated in FIG. 1(d), an optional n type barrier layer (NBL) 101 may present between the substrate 201 and the various regions of the ESD protection circuit 100, such as the first region 107 and the second region 103, so that the first region 107 and the second region 103 are formed on the NBL 101. The NBL 101 may serve as a barrier against the movement of electrons and holes of a semiconductor. The NBL 101 may be formed as a deep n type well, for example.

Figure 2A:
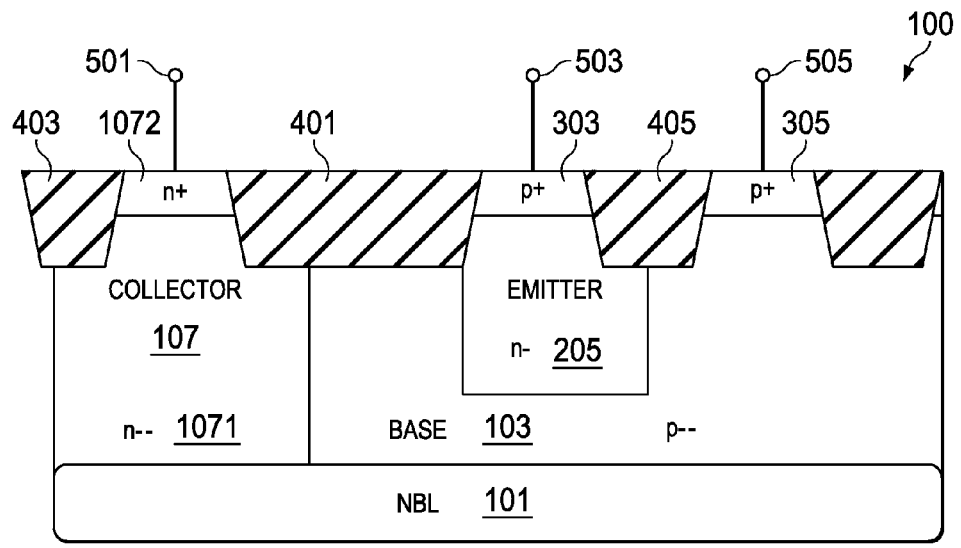
FIGS. 2(a)-2(c) illustrate in cross sectional views additional embodiments of ESD protection circuits.
Figure 2B:
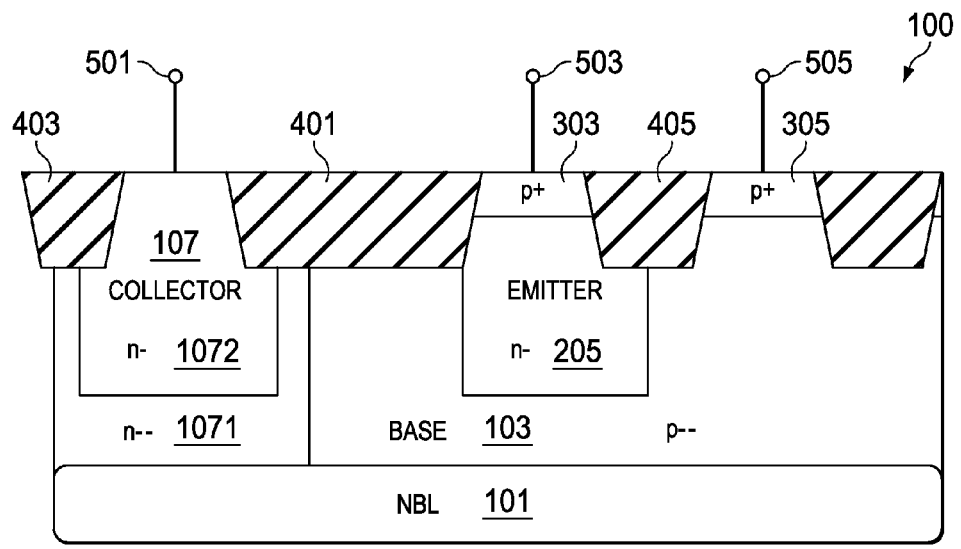
Figure 2C:
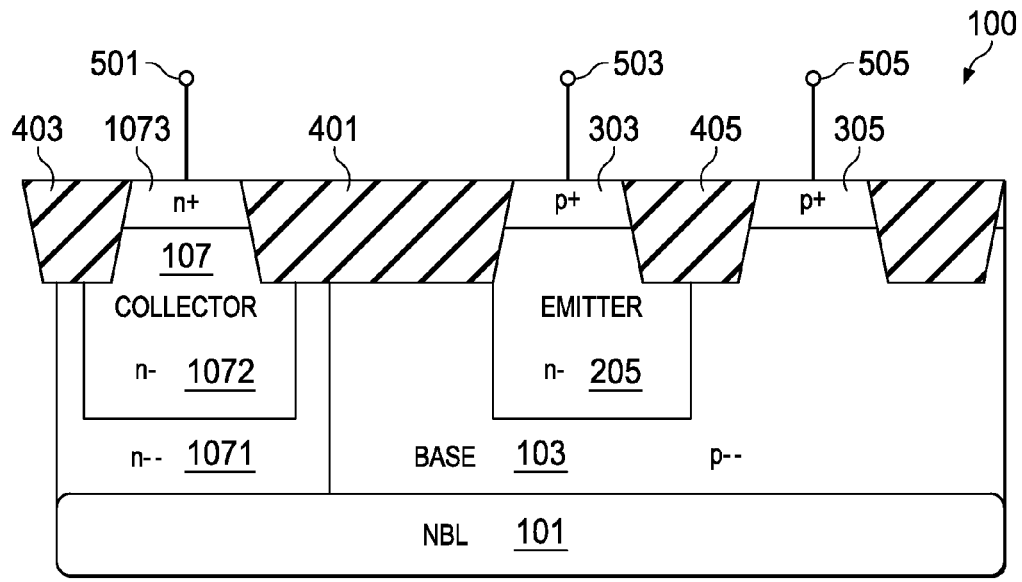

FIGS. 2(a)-2(c) illustrate in cross sectional views additional embodiments of ESD protection circuits, where the first region 107 may comprise multiple parts with different n type materials. For example, as shown in FIG. 2(a), the first region 107 comprises a first part 1071 comprising the first n type material shown as an n−− type material, and a second part 1072 comprising another n type material shown as an n+ type material, while both the first part and the second part function together as a collector 107 for the lateral NPN BJT 200 as shown in FIG. 1(b). The second part 1072 may comprise another n type material shown as an n− type material in FIG. 2(b). Furthermore, the area of the second part 1072 in FIG. 2(b) may have bigger depth compared to the second part 1072 shown in FIG. 2(a). Any other n type material may be used for the second part 1072 of the first region 107.

Alternatively, as shown in FIG. 2(c), the first region 107 comprises a first part 1071 comprising the first n type material shown as an n−− type material, a second part 1072 comprising another n type material shown as an n− type material, and a third part 1073 comprising yet another n type material shown as an n+ type material in FIG. 2(c), while the first part, the second part, and the third part function together as a collector 107 for the lateral NPN BJT 200 as shown in FIG. 1(b). Any other type of n material may be used for any of the first part 1071, the second part 1072, and the third part 1073 of the first region 107.

Similarly as described for FIG. 1(a), the embodiment in FIGS. 2(a)-2(c) further comprises a second region 103, a third region 205 formed within the second region 103, and a fourth region 303 formed within the third region 205. An isolation area 401 is formed to separate the first region 107 and the third region 205. The second region 103 is shown as a p−− type material, and the fourth region 303 is shown as a p+ type material, yet any other p type material may be used. The third region 205 is shown as an n− type material, yet any other n type material may be used. A contact 501 may be formed in connection with the first region 107 and another contact 503 may be formed in connection with the fourth region 303. An additional isolation area 405 may be formed within the second region 103 and the third region 205 to separate the fourth region 303 from other area of the two regions. Another isolation area 403 is further formed. An additional diffusion area 305 may be formed next to the isolation area 405, and connected to a contact 505. An optional n type barrier layer (NBL) 101 is under all the regions.

Figure 3A:
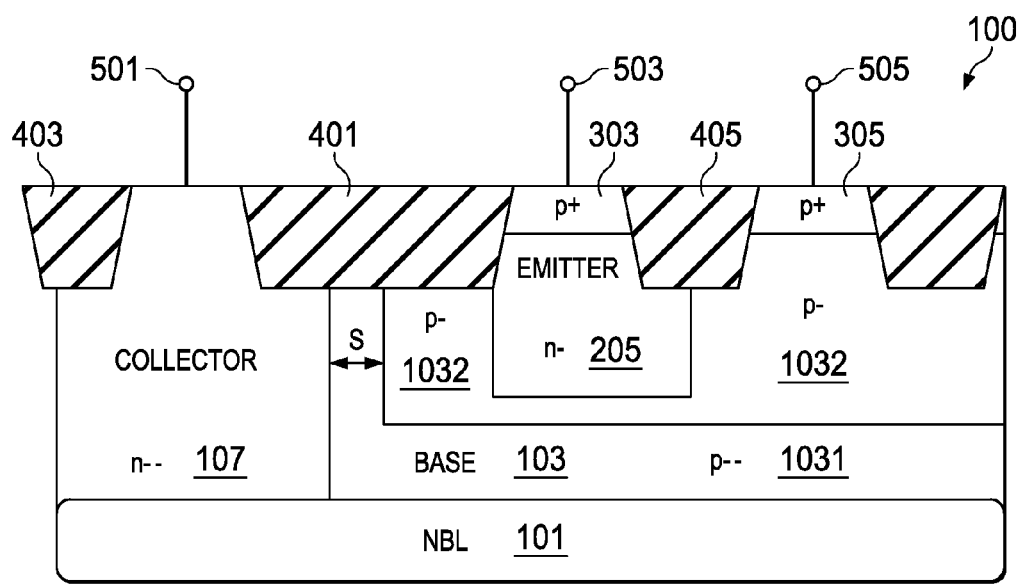
FIGS. 3(a)-3(b) illustrate in cross sectional views additional embodiments of ESD protection circuits.
Figure 3B:
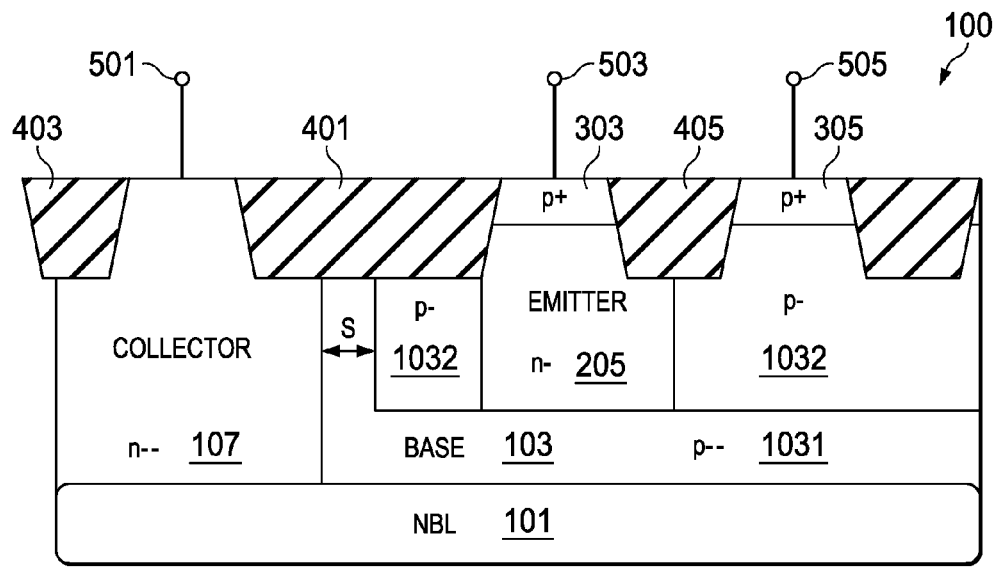

FIGS. 3(a)-3(b) illustrate in cross sectional views additional embodiments of ESD protection circuits, where the second region 103 may comprise multiple parts with different p type materials. For example, as shown in FIG. 3(a), the second region 103 comprises a first part 1031 of a p−− type material, and a second part 1032 of a p− type material, while both the first part 1031 and the second part 1032 function together as a base 103 for the lateral NPN BJT 200 as shown in FIG. 1(b). As shown in FIG. 3(a), the second part 1032 is formed within the first part 1031, wherein the second part 1032 is a continuous part. Furthermore, the trigger voltage of the ESD protection circuit 100 may be determined by the layout parameter S, which is the distance between the boundary of the second part 1032 of the second region, to the boundary of the first region 107. When S is changed, the ESD protection circuit 100 will have a different trigger voltage. The second part 1032 is formed so that the second part 1032 extends below the third region 205.

Alternatively, as shown in FIG. 3(b), the second region 103 comprises a first part 1031 of a p−− type material, and a second part 1032 of a p− type material, while the second part 1032 is formed so that the third region 205 extends to a bottom of the second part 1032 of the second region 103, and the third region 205 separates the second part 1032 into two discontinuous region in the cross-section view. The first part 1031 of the second region comprises a p−− type material, and the second part 1032 comprises a p− type material, while both the first part 1031 and the second part 1032 function together as a base 103 for the lateral NPN BJT 200 as shown in FIG. 1(b).

The embodiments in FIGS. 3(a)-3(b) further comprise a first region 107, a third region 205 formed within the second region 103, and a fourth region 303 formed within the third region 205. An isolation area 401 is formed to separate the first region 107 and the third region 205. The first region 107 is shown as an n−− material, yet any other n type material may be used, and the fourth region 303 is shown as a p+ type material, yet any other p type material may be used. The third region 205 is shown as an n− type material, yet any other n type material may be used. A contact 501 may be formed in connection with the first region 107 and another contact 503 may be formed in connection with the fourth region 303. An additional isolation area 405 may be formed within the second region 103 and the third region 205 to separate the fourth region 303 from other area of the two regions. Another isolation area 403 is further formed. An additional diffusion area 305 may be formed next to the isolation area 405, and connected to a contact 505. An optional n type barrier layer (NBL) 101 is under all the regions.

Figure 4A:
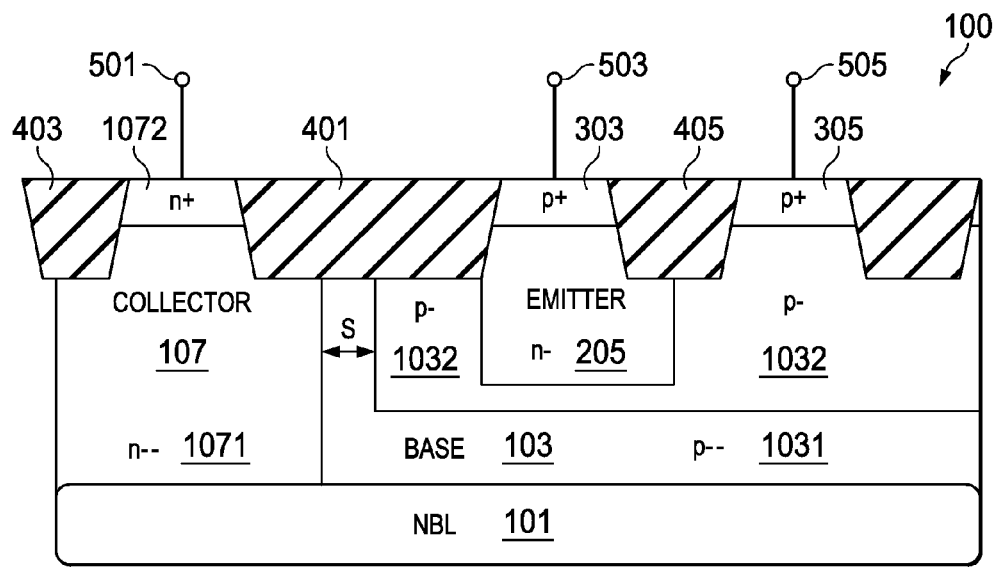
FIGS. 4(a)-4(c) illustrate in cross sectional views and a circuit diagram of additional embodiments of ESD protection circuits.

Various formations of the first region 107 shown in FIGS. 2(a)-2(c) and the formations of the second region 103 shown in FIGS. 3(a)-3(b), in addition to those formations not shown, may be combined together to have many different kinds of embodiments for the ESD protection circuit 100. For example, as shown in FIG. 4(a), the first region 107 comprises a first part 1071 and a second part 1072. The first part 1071 comprises an n−− type material and the second part 1072 comprises an n+ type material, while the second region 103 comprises a first part 1031 and a second part 1032. The first part 1031 comprises a p−− type material and a second part 1032 comprises a p− type material. The first part 1071 and the second part 1072 of the first region 107 function as the collector as shown in FIG. 1(b). The first part 1031 and the second part 1032 of the second region 103 function as the base as shown in FIG. 1(b).

Figure 4B:
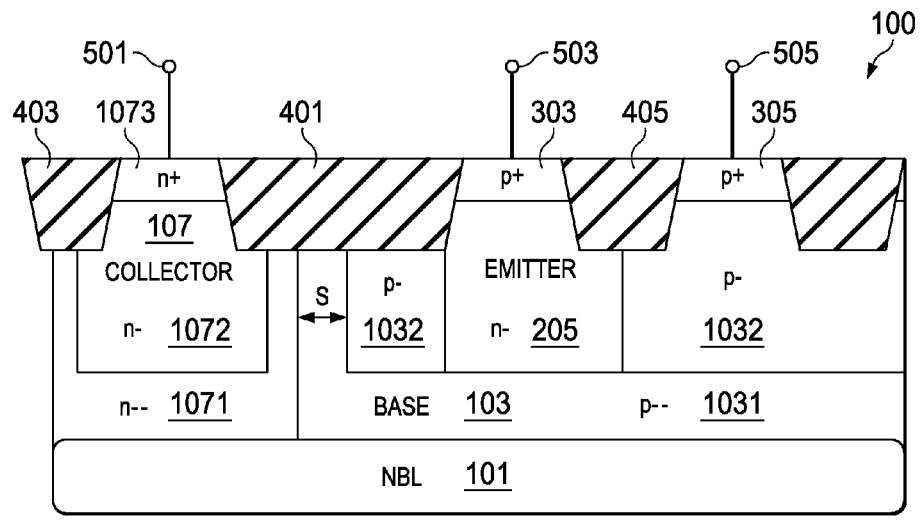

Alternatively, as shown in FIG. 4(b), the first region 107 comprises three parts, a first part 1071, a second part 1072, and a third part 1073. The first part 1071 comprises an n−− type material, a second part 1072 comprises an n− type material, and a third part 1073 comprises an n+ type material. The second region 103 comprises a first part 1031 and a second part 1032. The first part 1031 comprises a p−− type material and a second part 1032 comprises a p− type material. The first part 1071, the second part 1072, and the third part 1073 of the first region 107 function as the collector 107 as shown in the circuit schematic diagram FIG. 4(c). The first part 1031 and the second part 1032 of the second region 103 function as the base as shown in the circuit schematic diagram FIG. 4(c).

Figure 4C:
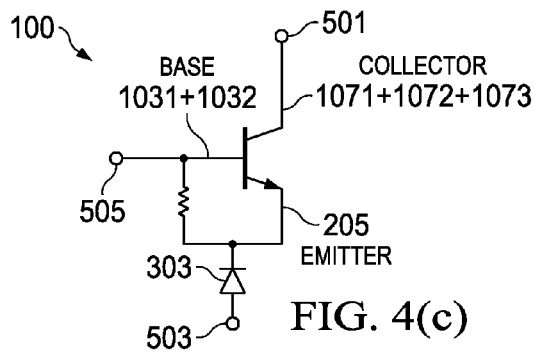

The embodiments in FIGS. 4(a)-4(c) further comprises a third region 205 formed within the second region 103, and a fourth region 303 formed within the third region 205. An isolation area 401 is formed to separate the first region 107 and the third region 205. The third region 205 is shown as an n− type material, yet any other n type material may be used. The fourth region 303 is shown as a p+ type material, yet any other p type material may be used. The third region 205 and the fourth region 303 function as a PN diode as shown in FIG. 4(c). A contact 501 may be formed in connection with the first region 107 and another contact 503 may be formed in connection with the fourth region 303. An additional isolation area 405 may be formed within the second region 103 and the third region 205 to separate the fourth region 303 from other area of the two regions. An additional isolation area 403 is formed as well. An additional diffusion area 305 may be formed next to the isolation area 405, and connected to a contact 505. An optional n type barrier layer (NBL) 101 is under all the regions.

Figure 5:
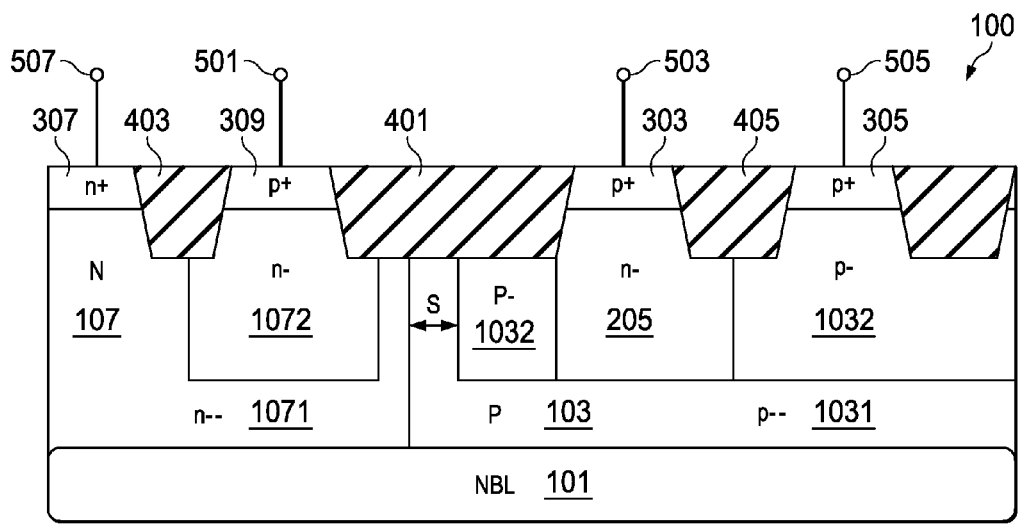
FIG. 5 illustrates an additional embodiment of an ESD protection circuit.

FIG. 5 illustrates an additional embodiment of an ESD protection circuit, where a fifth region 309 is formed within the first region 107. The fifth region 309 is shown as a p+ type material, yet any other p type material may be used.

Similarly to embodiments shown in FIGS. 2(a)-2(c), the first region 107 shown in FIG. 5 comprises a first part 1071 and a second part 1072. The first part 1071 comprises an n−− type material, and the second part 1072 comprises an n− type material, yet any other n type material may be used for either part. Alternatively, the first region 107 may comprise more than two parts, or comprise only one part, with any kind of n type material. Similarly to embodiments shown in FIGS. 3(a)-3(b), the second region 103 shown in FIG. 5 comprises a first part 1031 and a second part 1032. The first part 1031 comprises a p−− type material, and the second part 1032 comprises a p− type material, yet any other p type material may be used for either part. Alternatively, the second region 103 may comprise more than two parts, or comprise only one part, with any kind of p type material.

The embodiments in FIG. 5 further comprises a third region 205 formed within the second region 103, and a fourth region 303 formed within the third region 205. An isolation area 401 is formed to separate the first region 107 and the third region 205. The third region 205 is shown as an n− type material, yet any other n type material may be used. The fourth region 303 is shown as a p+ type material, yet any other p type material may be used.

A contact 501 may be formed in connection with the fifth region 309 and another contact 503 may be formed in connection with the fourth region 303. An additional isolation area 405 may be formed within the second region 103 and the third region 205 to separate the fourth region 303 from other area of the two regions. Another contact 507 may be connected to the first region 107 by way of an additional part 307 of a different n type material, such as the n+ type material 307 shown in FIG. 5. The additional part 307 is separated from the fifth region 309 by an isolation area 403. Alternatively, the contact 507 may be connected to the first region 107 directly, not shown. An additional diffusion area 305 may be formed next to the isolation area 405, and connected to a contact 505. An optional n type barrier layer (NBL) 101 is under all the regions.

As shown in FIG. 5, the fifth region 309 comprising a p type material, the first region 107, the second region 103, and the third region 205 may function as a SCR circuit of PNPN structure. Furthermore, the third region 205 and the fourth region 303 may function as an embedded PN diode, achieving an adjustable holding voltage, reducing the gap between the trigger voltage and the holding voltage. Furthermore, the trigger voltage of the ESD protection circuit 100 may be determined by the layout parameter S, which is the distance between the boundary of the second part 1032 of the second region 103 to the boundary of the first region 107. When S is changed, the ESD protection circuit 100 will have a different trigger voltage.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate;
   a first region in the substrate, the first region comprising a first n type material;
   a second region in the substrate, the second region comprising a first p type material and adjacent to the first region, wherein the first region and the second region do not overlap;
   a third region comprising a second n type material within the second region and separated from the first region by the second region, and the third region being separated from the first region by an isolation area that is adjacent to and disposed between the first region and the third region, and the isolation area being partly contained within the first region and partly contained within the second region; and
   a fourth region comprising a second p type material within the third region and adjacent to the isolation area.

2. The semiconductor device of claim 1, further comprising an n type buried layer or a deep n type well in the substrate, and under the first region and the second region.

3. The semiconductor device of claim 1, further comprising a first contact connected to the first region, a second contact connected to the second region, and a third contact connected to the fourth region.

4. The semiconductor device of claim 1, wherein the first region comprises a first part comprising the first n type material and a second part comprising a third n type material.

5. The semiconductor device of claim 4, wherein the first region further comprises a third part comprising a fourth n type material.

6. The semiconductor device of claim 5, wherein the first n type material is an n−− type material, the third n type material is an n− type material, and the fourth n type material is an n+ type material.

7. The semiconductor device of claim 1, wherein the second region comprises a first part comprising the first p type material, and a second part comprising a third p type material contained within the first part of the second region, and the third region is contained within the second part of the second region.

8. The semiconductor device of claim 7, wherein the first p type material is a p−− type material, and the third p type material is a p− type material.

9. The semiconductor device of claim 1, further comprising a fifth region comprising a fourth p type material, wherein the fifth region is contained within the first region, and separated from the fourth region by the isolation area.

10. The semiconductor device of claim 9, wherein the first region comprises a plurality of different n type materials.

11. A method forming a semiconductor device, comprising:
    providing a substrate;
    forming a first region in the substrate comprising a first n type material, wherein the first region extends a first depth from a top surface of the substrate;
    forming a second region in the substrate comprising a first p type material and adjacent to the first region, wherein the second region extends a second depth from a top surface of the substrate, the second depth being substantially equal to the first depth;
    forming an isolation area partly contained within the first region and partly contained within the second region, the isolation area sharing a planar surface with the first region and the second region;
    forming a third region adjacent to the isolation area comprising a second n type material within the second region and separated from the first region by the second region and the isolation area; and
    forming a fourth region comprising a second p type material within the third region.

12. The method of claim 11, further comprising forming a first contact connected to the first region, a second contact connected to the second region, and a third contact connected to the fourth region.

13. The method of claim 11, wherein forming the first region comprises forming a first part comprising the first n type material and forming a second part comprising a third n type material.

14. The method of claim 13, wherein forming the first region further comprises forming a third part comprising a fourth n type material.

15. The method of claim 14, wherein the first n type material is an n−− type material, the third n type material is an n− type material, and the fourth n type material is an n+ type material.

16. The method of claim 11, wherein forming the second region comprises forming a first part comprising the first p type material and forming a second part comprising a third p type material contained within the first part of the second region, and the third region is contained within the second part of the second region.

17. The method of claim 16, wherein the first p type material is a p−− type material, and the third p type material is a p− type material.

18. The method of claim 11, further comprising forming a fifth region comprising a fourth p type material, wherein the fifth region is contained within the first region, and separated from the fourth region by the isolation area.

19. A semiconductor device comprising:
    a substrate;
    a first region in the substrate, wherein the first region comprises a first part comprising a first n type material and a second part comprising a second n type material;
    a second region in the substrate and adjacent to and laterally displaced from the first region, wherein the second region comprises a third part comprising a first p type material and a fourth part comprising a second p type material;
    a third region comprising a third n type material within the second region and separated from the first region by the second region and by an isolation area disposed between the first region and the second region, wherein the isolation area is partly contained within the first region and partly contained within the second region; and a fourth region comprising a third p type material within the third region.

20. The semiconductor device of claim 19, further comprising a fifth region comprising a fourth p type material, wherein the fifth region is contained within the first region, and separated from the fourth region by the isolation area.

* * * * *